(12) United States Patent
Owers-Bradley et al.

(10) Patent No.: US 9,404,984 B2
(45) Date of Patent: Aug. 2, 2016

(54) METHOD OF HYPERPOLARIZATION APPLYING BRUTE FORCE USING PARTICULATE ACCELERATION AGENTS

(71) Applicant: Bruker UK Ltd., Coventry (GB)

(72) Inventors: John Robert Owers-Bradley, Ruddington (GB); David Geoffrey Gadian, Royston (GB); Anthony John Horsewill, Nottingham (GB)

(73) Assignee: Bruker UK Limited, Coventry CV4 9GH (GB)

( * ) Notice: Subject to any disclaimer, the term of this patent is extended or adjusted under 35 U.S.C. 154(b) by 794 days.

(21) Appl. No.: 13/669,565

(22) Filed: Nov. 6, 2012

(65) Prior Publication Data

US 2014/0125334 A1    May 8, 2014

(51) Int. Cl.
*G01V 3/00* (2006.01)
*G01R 33/44* (2006.01)
*G01R 33/28* (2006.01)
*G01R 33/56* (2006.01)

(52) U.S. Cl.
CPC .............. *G01R 33/44* (2013.01); *G01R 33/282* (2013.01); *G01R 33/5601* (2013.01)

(58) Field of Classification Search
CPC ...................................................... G01R 33/44
USPC ....................................................... 324/309
See application file for complete search history.

(56) References Cited

U.S. PATENT DOCUMENTS

| 2002/0058869 | A1* | 5/2002 | Axelsson et al. ............. 600/423 |
| 2007/0218009 | A1* | 9/2007 | van Veggel .......... A61K 41/009 424/9.34 |
| 2007/0279054 | A1* | 12/2007 | Candidus et al. ............. 324/300 |
| 2009/0016964 | A1* | 1/2009 | Kalechofsky et al. ......... 424/9.3 |
| 2010/0201362 | A1* | 8/2010 | Holman, III .................. 324/310 |
| 2011/0062392 | A1* | 3/2011 | Kalechofsky et al. ........ 252/582 |
| 2013/0274111 | A1* | 10/2013 | Jannin et al. .................. 505/180 |
| 2014/0091792 | A1* | 4/2014 | Jannin et al. .................. 324/309 |

(Continued)

FOREIGN PATENT DOCUMENTS

| WO | WO 99/24080 | 5/1999 |
| WO | WO 99/35508 | 7/1999 |

(Continued)

OTHER PUBLICATIONS

Jan H. Ardenkjaer-Larsen et al., "Increase in signal-to-noise ratio of >10,000 times in liquid-state NMR", PNAS, Sep. 2, 2003, vol. 100, No. 18, 10158-10163.

(Continued)

*Primary Examiner* — Rodney Fuller
(74) *Attorney, Agent, or Firm* — Paul Vincent

(57) ABSTRACT

A method for hyperpolarizing nuclei contained in an MR (=magnetic resonance) agent using Brute Force, has the steps of a) providing a sample (1), including the MR agent, optionally dissolved in a solvent, and a relaxation agent (2); and b) exposing the sample (1) to a magnetic field $B_0$, with $B_0 \geq 0.5$ T, and a cryogenic temperature Tcr, with Tcr≤5K. The method is characterized in that the relaxation agent (2) is a particulate relaxation agent (2) having particles of a grain size of 20 μm or less, with a volume content of these particles of at least 1% within the sample. An improved Brute Force hyperpolarization method is thereby provided, which is broadly applicable and simple to perform.

17 Claims, 4 Drawing Sheets

(56) References Cited

U.S. PATENT DOCUMENTS

| | | | |
|---|---|---|---|
| 2014/0223923 A1* | 8/2014 | Kalechofsky et al. | ............ 62/3.1 |
| 2015/0185306 A1* | 7/2015 | Sidles et al. | |

FOREIGN PATENT DOCUMENTS

| | | |
|---|---|---|
| WO | WO 00/23797 | 4/2000 |
| WO | WO 02/37132 | 5/2002 |
| WO | WO 2008/155093 | 12/2008 |
| WO | WO 2009/004357 | 1/2009 |
| WO | WO 2011/026103 | 3/2011 |

OTHER PUBLICATIONS

J.S. Waugh et al. "Reply to Comment on 'Mechanism of nuclear spin-lattice relaxation in insulators at very low temperatures'", Physical Review B, vol. 40, No. 6, Aug. 15, 1989—II.

N. Biskup et al., "Spin polarization of xenon films at low-temperature", Physica B 329-333, (2003), 437-438.

J. Korringa "Nuclear Magnetic Relaxation and Resonance Line Shift in Metals", Physica XVI, No. 7-8, Jul./Aug. 1950.

David G. Gadian et al., "Preparation of highly polarized nuclear spin systems using brute-force and low-field thermal mixing", Phys. Chem. Chem. Phys. 2012, 14, 5397-5402.

Sami Jannin et al., "Low-temperature cross polarization in view of enhancing dissolution Dynamic Nuclear Polarization in NMR", Chemical Physics Letters 517 (2011), 234-236.

* cited by examiner

METHOD OF HYPERPOLARIZATION APPLYING BRUTE FORCE USING PARTICULATE ACCELERATION AGENTS

BACKGROUND OF THE INVENTION

The invention relates to a method for hyperpolarizing nuclei contained in an MR (=magnetic resonance) agent using Brute Force, with the steps of a) providing a sample, including the MR agent, optionally dissolved in a solvent, and a relaxation agent; and b) exposing the sample to a magnetic field $B_0$, with $B_0 \geq 0.5$ T, and a cryogenic temperature Tcr, with Tcr$\leq$5K.

Such a method is known from WO 2009/004357 A2.

NMR (NMR: nuclear magnetic resonance) techniques, both in the field of spectroscopy (MRS: magnetic resonance spectroscopy) and imaging (MRI: magnetic resonance imaging), may be applied to gather information about a sample or sample area in a gentle, non-destructive way; in particular, clinical investigations on living patients can be done non-invasively. However, NMR techniques are generally limited by low signal intensities.

One way to increase signal intensities is to apply hyperpolarization techniques. Here, nuclei in a sample are prepared with a polarization level higher than corresponding to the Boltzmann distribution, and the hyperpolarized nuclei undergo an NMR experiment. In many NMR experiments, information about low γ/long T1 nuclei, respectively, are of particular interest, above all about $^{13}$C and $^{15}$N (γ: gyromagnetic ratio or gamma; T1: longitudinal relaxation time). Common methods are Dissolution Dynamic Nuclear Polarization (Dissolution DNP), Para-Hydrogen Induced Polarization (PHIP), and Brute Force Hyperpolarization (BFH).

Dissolution DNP (e.g. WO 1999/035508 Ardenkjaer-Larsen et al., WO 2002/037132-Ardenkjaer-Larsen et al.) has enjoyed relatively wide-spread acceptance by the commercial availability of dedicated equipment for hyperpolarization in the solid state followed by dissolution of the hyperpolarized sample. The method, however, has the draw-back that relatively complex instrumentation is required, including provisions for micro-wave irradiation of the solid sample, and that the sample must contain a polarizing agent, typically a free radical. For in vivo use of the dissolved sample the polarizing agent needs typically to be removed by chemical means. Moreover, unless the sample is continuously subjected to the conditions for hyperpolarization, the presence of the free radicals typically causes the enhanced polarization to be lost rapidly through relaxation and therefore the sample needs to be used immediately following the polarization process. In order to accelerate the preparation of hyperpolarized low γ/long T1 nuclei (such as $^{13}$C) here, it has been proposed to polarize $^1$H nuclei by DNP followed by a polarization transfer to the low γ nuclei such as $^{13}$C through the application of appropriate RF Cross Polarization pulses (e.g. S. Jannin et. al., Chem. Phys. Lett., 2011, 517, 234).

PHIP (e.g. WO1999/024080 Golman et al., WO 2008/155093 Duckett et al.) has not been accepted as broadly as Dissolution DNP mainly because the (catalytic) polarization transfer from para-hydrogen to the substrate molecule makes the method specific to certain classes of molecules. The catalyst is in general toxic and cannot be injected in vivo. Therefore the catalyst typically has to be removed in an additional step. Also, because the sample is in the liquid phase, thereby exhibiting liquid state T1 values which are typically relatively short, the polarization is lost through relaxation and the sample needs to be used immediately following the polarization transfer step.

In BFH (e.g. WO 2009/004357 Gadian, WO 2011/026103 Kalechofsy et al.) the nucleus of interest is polarized by generating very large thermal polarization at very low temperature and in a very strong magnetic field, followed by rapid heating of the sample. BFH is a rather general method; any substance can be polarized to very high degree of spin order corresponding to the Boltzmann distribution at a very high ratio of magnetic field strength and temperature. This spin order can in principle be maintained in the solid state for a relatively long time (many hours) at a moderately low temperature and modest magnetic field. There is no need for the addition of chemicals such as catalysts or free radicals and complex micro wave equipment is not required. Once the sample is brought to room temperature, a very high degree of Zeeman order is achieved resulting in the desired increase in NMR signal strength.

One disadvantage, however, of BFH is the long polarization build-up time, typically in the order of hundreds or thousands of hours. A potential mitigation of this problem is to make use of relaxation agents (also called acceleration agents) which allow for a faster build-up of the polarization. Care needs to be taken in the choice of the relaxation agent such as not to suffer rapid loss of polarization once the sample is brought into the liquid phase, though.

Kalechofsky et al. (WO 2011/026103) propose to make use of the specific temperature dependence of the relaxing effect of methyl rotors. This method allows rapid polarization build-up at low temperature and high magnetic field and the prolonged storage of the hyperpolarized material at intermediate field and temperature. The requirement to have methyl groups present in the substrate (MR agent), however, reduces the scope of the method to certain molecules. Kalechofsky et al. also propose to hyperpolarize the nuclei of interest indirectly by generating very large thermal $^1$H polarization at a very low temperature, followed by low field nuclear thermal mixing, transferring polarization to the nuclei of interest.

Gadian (WO 2009/004357) proposes the use of certain lanthanide complexes which have a favourable temperature/field dependence of their effectiveness as relaxation agent and can accelerate the polarization build-up rate by up to two orders of magnitude, from many days to hours. The lanthanide complexes, however, need to be either removed in the dissolution step, or used in their chelated form, to allow in vivo use.

It is the object of the invention to provide an improved Brute Force hyperpolarization method, which is broadly applicable and simple to perform.

SUMMARY OF THE INVENTION

This object is achieved, in accordance with the invention, by a method as introduced in the beginning, characterized in that the relaxation agent is a particulate relaxation agent comprising particles of a grain size of 20 μm or less, with a volume content of these particles of at least 1% within the sample.

The present invention proposes to apply a particulate relaxation agent, i.e. a relaxation agent comprising solid particles. According to the invention, said particles act as relaxation agent for nuclei in the sample to be polarized by Brute Force.

The inventors found that numerous particulate materials, above all conducting materials such as metals, but also non-conducting materials such as copper oxide, provide a significant enhancement of T1 relaxation on nuclei of other substances (such as an MR agent or a solvent) at low temperatures, in particular if the particle size is in the nanometer range, such as with a D50 particle size of 100 nm or less.

With particulate relaxation agents, mechanisms which act at the surface of the solid particles may be accessed for accelerating the thermal polarization build-up in the sample. The properties of electrons close to the particle surface, possibly interacting with bulk particle electrons, in particular the properties of conduction electrons, may contribute to the relaxation mechanism. Note that a dissolved relaxation agent, such as lanthanide ions, behaves much different from a particulate solid relaxation agent, even if the solution of the dissolved relaxation agent is frozen. This may be due to the different contribution of the electrons in different types of bonds. More specifically, dissolved relaxation agents cannot, in general, provide conduction electrons.

The ratio of particle surface per weight (or per volume) of relaxation agent may be chosen via the particle size. It should also be noted that the particles are typically provided as a suspension, in most cases with the NMR agent dissolved in the suspension, preferably with a homogenous distribution of the particles in the suspension. The sample is typically liquid at room temperature, but frozen at the cryogenic temperature used in step b).

As a particular advantage of the invention, the particulate relaxation agent can be removed in a very simple way, preferably by filtration. However other removal measures such as centrifugation may be applied alternatively or in addition. In accordance with the invention, no chemicals have to be added to remove the particles.

In the course of the inventive method, it is typically desired to polarize low $\gamma$ nuclei (such as $^{13}$C or $^{15}$N) contained in the MR agent by Brute Force and measure them in a subsequent NMR experiment. It is also possible to polarize high $\gamma$ nuclei (such as $^1$H) contained in the MR agent by Brute Force and measure them in a subsequent NMR experiment. Note that the MR agent as such may be a liquid containing the particulate relaxation agent. Further, it is possible to polarize high $\gamma$ nuclei (such as $^1$H) contained in the MR agent or a solvent of the sample by Brute Force (typically including some polarization of low $\gamma$ nuclei contained in the MR agent), and subsequently transferring the polarization from the high $\gamma$ nuclei to the low $\gamma$ nuclei, for example by Cross Polarization or low field nuclear thermal mixing. In all cases, the solid particle relaxation agent supports the initial Brute Force polarization step.

In summary, the invention proposes a novel class of relaxation agents (acceleration agents) consisting of small particles, in particular conductive nano-particles, which exhibit a favourable temperature and field dependence in their relaxivity. Mixed in a frozen solution of any substrate, they allow the rapid establishment of a high Boltzmann polarization of nuclei at a high (static) magnetic field (typically $\geq 1$ T, preferably $\geq 10$ T, most preferably $\geq 15$ T or higher) and at a low temperature (in general $\leq 5$K, preferably $\leq 100$ mK, even more preferably $\leq 10$ mK). Compared to polarizing the substrate on its own, the polarization build-up time is in general reduced by a factor of 2 or more, preferably by a factor of 10 or more, even more preferably by a factor 100 or more.

In a particularly preferred variant of the inventive method, said particles are electrically conductive and/or conductively coated particles. Conduction electrons, accessible at the surface of electrically conducting particles or particles having an electrically conductive coating, seem to enhance the relaxation process very efficiently.

Also preferred is a further development of this variant, wherein the electrically conductive and/or conductively coated particles include metal and/or metal coated particles. Metal particles and metal coated particles are both simple to provide, in particular in small sizes, and efficient in the relaxation enhancement.

Advantageously, the electrically conductive or conductively coated particles include copper and/or copper coated and/or platinum and/or platinum coated particles. These materials have led to particularly pronounced shortenings in T1 in practice.

In another preferred variant, said particles include graphene and/or graphene coated particles. Graphene, which exhibits significant electrical conductivity (in plane), has shown useful relaxation enhancement in practice.

Further, in a preferred variant, said particles include copper oxide or copper oxide coated particles. Copper oxide, which is not conductive, has also shown useful relaxation enhancements in practice. Both copper (I) oxide and/or copper (II) oxide may be used.

In an advantageous variant said particles have a volume content of 5% or more, preferably 10% or more, most preferably 20% or more, within the sample. These ratios have shown good results in practice; in general volume contents between 5% and 40% are typically used. Via the volume content, the available particle surface per volume of the sample can be chosen. The volume content within the sample (or volume ratio of the sample) is determined in a liquid state of the sample typically at room temperature.

Further preferred is a variant wherein the D50 grain size of said particles is 100 nm or less, preferably 50 nm or less, more preferably 30 nm or less, most preferably 20 nm or less. Generally, a lower D50 grain size leads to more surface area per volume content of the particles in the sample. A larger surface area can enhance the particles' effect on the relaxation process.

In a particularly preferred variant high $\gamma$ nuclei are contained in the sample, and low $\gamma$ nuclei are contained in the MR agent. In general, the high $\gamma$ nuclei (such as $^1$H) are faster to polarize by Brute Force than the low $\gamma$ nuclei (such as $^{13}$C); note that both nuclei experience at least some polarization during step b). The gyromagnetic ratio $\gamma$ of the high $\gamma$ nuclei (short T1 nuclei) is higher than the gyromagnetic ratio $\gamma$ of the low $\gamma$ nuclei (long T1 nuclei), preferably by a factor of at least 2. The high and low $\gamma$ nuclei may be contained in the same molecules or in different molecules.

An advantageous further development of this variant provides that the method comprises a further step of c) transferring polarization form the high $\gamma$ nuclei contained in the sample polarized in step b) to the low $\gamma$ nuclei contained in the MR agent. By this means, the relatively fast polarization of the high $\gamma$ nuclei by Brute Force can be exploited for a fast indirect polarization of the low $\gamma$ nuclei. Note that the low $\gamma$ nuclei typically keep their polarization better than the high $\gamma$ nuclei after a warming of the sample, e.g. to room temperature immediately before an NMR measurement.

Preferably, transferring the polarization in step c) is done by Cross Polarization, wherein the sample is irradiated with an RF pulse sequence. For Cross Polarization, oscillating magnetic fields are applied at the Larmor frequencies of the low $\gamma$ (long T1) nuclei and the high $\gamma$ (short T1) nuclei. RF (RF: radio frequency) pulse sequences known in the art for this purpose, in particular a Hartmann Hahn contact pulse sequence, may be used. Cross polarization allows a quick, efficient and reliable polarization transfer, which can be used with a wide range of samples.

Alternatively, transferring the polarization in step c) is done by low field nuclear thermal mixing. Low field nuclear thermal mixing (compare Gadian, D. G., et. al. Phys. Chem.

Chem. Phys., 2012, 14, 5397) is particularly simple to perform. The sample is briefly exposed to a low magnetic field such that the nuclear Zeeman energy of the nuclei is of the same order of magnitude or smaller than their dipolar interaction energy.

Preferred is a further development wherein the high γ nuclei are $^1H$ and/or $^{19}F$, and/or that the low γ nuclei are $^{13}C$ and/or $^{15}N$ and/or $^{31}P$. These elements are of particular importance in practice. Further, protons seem to be particularly suited for profiting from particulate relaxation agents.

In an advantageous variant, the sample includes a solvent containing $^1H$ nuclei, in particular wherein the solvent comprises water and/or glycerol. The $^1H$ nuclei of the solvent can be used for fast polarization as high γ nuclei, for subsequent polarization transfer to low γ nuclei (such as $^{13}C$) later on.

Advantageous is a variant wherein Tcr≤100 mK, preferably Tcr≤20 mK, most preferably Tcr≤10 mK. With lower cryogenic temperatures, higher polarization levels may be achieved.

Also advantageous is a variant wherein $B_0$≥10 T, preferably $B_0$≥5 T. With higher (static) magnetic field strengths, again higher polarization levels may be achieved.

In a preferred variant of the inventive method, the sample is exposed to $B_0$ and Tcr during 168 hours or less, preferably during 72 hours or less, more preferably during 24 hours or less, most preferably during 12 hours or less. By means of an inventive particulate relaxation agent, relatively short exposure times may be applied, while at the same time achieving high polarization levels, typically at least 50%, preferably 50-90%, or even close to equilibrium such as 90% or more of the equilibrium polarization level.

In an advantageous variant, the method comprises a further step of d) storing the sample containing hyperpolarized nuclei having received polarization in step b) and/or step c) at an intermediate temperature Tmed, with Tcr<Tmed<room temperature, and at an intermediate magnetic field Bmed, with $B_0$>Bmed>Bearth, wherein Bearth is the earth's magnetic field. With judicious choice of the storage magnetic field strength Bmed, the storage temperature Tmed, and relaxation agent concentration, the sample can be stored prior to dissolution and use for several hours, in accordance with the invention. The nature of the relaxation agent as a particulate relaxation agent generally leads to a favourable temperature and field dependence in their relaxivity for this purpose, i.e. with the relaxivity staying relatively low at higher temperatures and/or at lower magnetic fields.

Preferably, 4.2K≤Tmed≤90K and/or 200 mT≤Bmed≤1 T. Values within these intervals can well be established in practice. Note that storage at higher magnetic field strengths allows a longer storage time.

In another advantageous variant, after step b), the sample is liquefied by melting it or dissolving it in a solvent, in particular a heated solvent. This facilitates further transport, filtering (if desired) and use. If there is a step d) (storage), liquefying is in general done afterwards.

Advantageously, in a further development of the above variant, said particles are removed from the liquefied sample by filtration. Filtration is simple to perform, without chemically changing the sample. By filtration, the liquefied sample may be turned into an injectable, biocompatible solution or prepared for producing an injectable, biocompatible solution. Note that alternatively, the particles may be removed by other measures, such as centrifugation or by magnetic force in case of ferromagnetic particles.

Also within the scope of the present invention is a method of NMR spectroscopy or MR imaging, wherein a liquefied sample is produced according to the latter above two variants, and an NMR spectroscopy or MR imaging measurement is done on hyperpolarized nuclei contained in the liquefied sample. The inventive method is relatively inexpensive and simple, and may in particular be used in metabolic imaging.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is shown in the drawing.

DESCRIPTION OF THE PREFERRED EMBODIMENT

Overview Over the Invention

Figure 1:
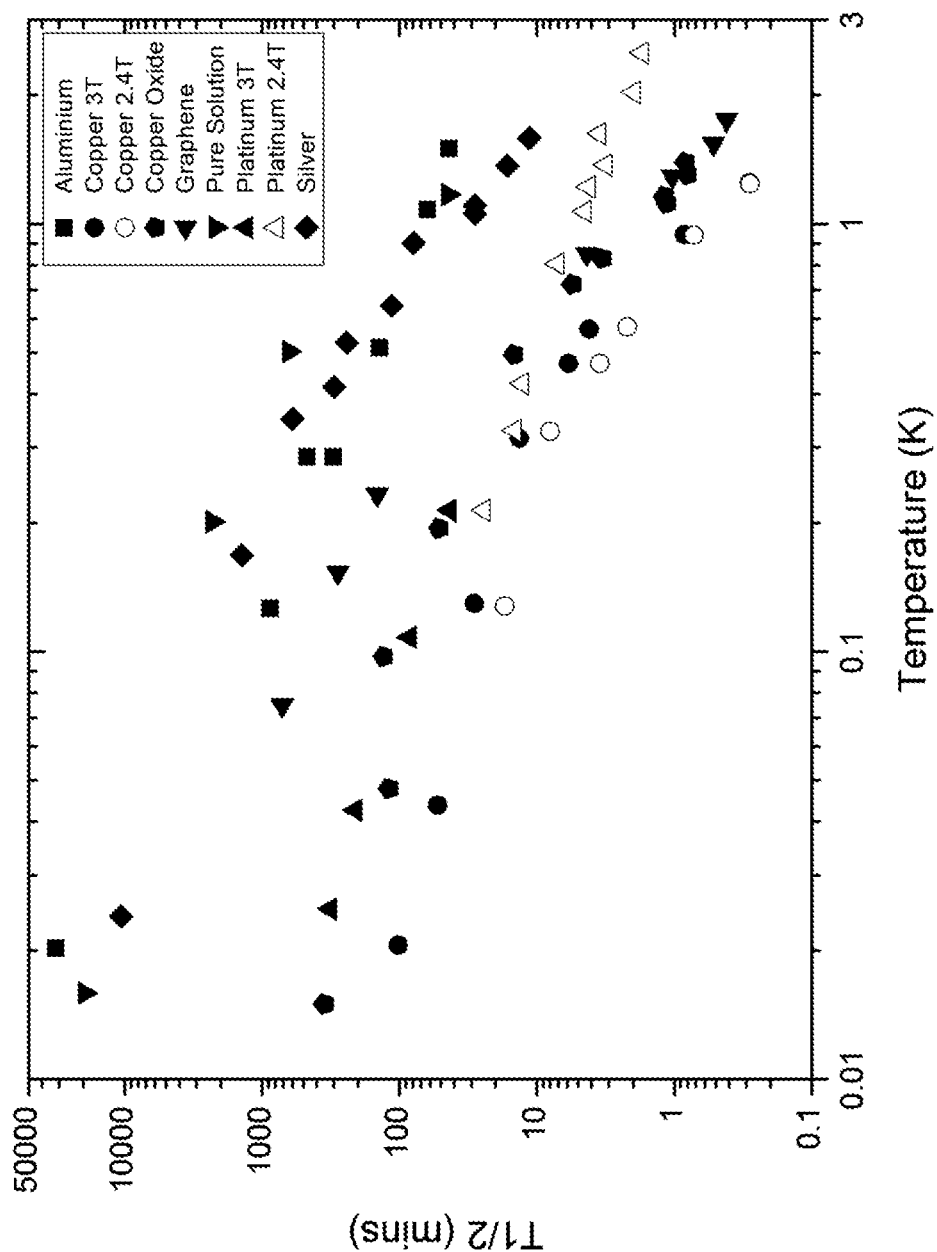
FIG. 1 shows a diagram illustrating T1/2 values of proton polarization by an inventive brute force method versus temperature, using different types of particulate relaxation agents.

The invention relates to a (nano-)particle-enhanced brute-force polarization of nuclear spins. Nuclear magnetic resonance (NMR) techniques are extensively used in many areas of basic and clinical research, as well as in diagnostic medicine, and in other fields such as analytical chemistry. However, compared with many other technologies, including those using radioisotopes, NMR is insensitive in the sense that large amounts of material are needed in order to obtain detectable signals. This imposes constraints, for example, on the clinical utility of magnetic resonance spectroscopy. The sensitivity of NMR is poor because the net polarization of the nuclear spins is typically only ~1 part in $10^4$-$10^6$, and so signal is detected from a correspondingly small percentage of nuclei. In accordance with the invention, exposure of a sample to very low temperatures and high magnetic fields, in conjunction with (nano-)particle-mediated relaxation enhancement, can be used to generate massive increases in nuclear polarization on a realistic timescale; $^{13}C$ polarization grew from 3% to about 18% in about 6 days. The inventive enhanced 'brute-force' approach enables the generation and storage of large scale quantities of highly polarized materials, with implications stretching across a wide range of disciplines, from basic materials science to biomedicine.

Introduction

Within the NMR community, there is intense interest in the development of techniques that can generate high levels of nuclear spin polarization. There are diverse applications, both in vitro (for example in structural biology), and in vivo (for example in cancer monitoring and assessment of therapy). However, the techniques that are available, including dynamic nuclear polarization (DNP), optical pumping, and methods exploiting parahydrogen, all have certain limitations given the demands on the levels of polarization that can be achieved, the diversity and amounts of nuclei and molecules that can be polarized, the ease of use and clinical applicability.

The invention presents an alternative strategy that addresses some of these limitations. The central notion is that as the temperature is reduced, the equilibrium nuclear polarization will increase, according to the Boltzmann distribution. This has been termed the 'brute force' approach. For example, at 7 millikelvin (mK) and a field of 16 T (conditions achievable with existing technology), the equilibrium polarization of $^{13}$C nuclei would be approximately 50%, i.e. about 100,000-fold greater than typical room temperature values. One problem is how to maintain this level of polarization following subsequent rewarming/dissolution, a procedure that is inevitably required for the majority of applications. This is an issue that has been addressed in analogous studies using DNP [1]. The more fundamental problem is that it may take an excessively long time for the nuclear polarization to approach thermal equilibrium at very low temperatures, such as several months. It should be noted that Waugh et al. found a system with surprisingly short T1 values as compared to standard relaxation theory; it was suggested that this might occur via a 'wobble' mechanism involving paramagnetic impurities [2]. However, their short T1 values were still on the order of $10^7$ seconds, i.e. several months.

One of the goals of the invention is to generate high polarization levels of nuclei that have long T1 relaxation times at room temperature. These nuclei are preferred because in vivo studies, which involve administration of pre-polarized materials (for example $^{13}$C- or $^{15}$N-labelled metabolites), require T1 values that are long enough to ensure that adequate polarization remains following delivery of the nuclei to the target of interest (for example to a tumour within the body). Nuclei with long relaxation times include the 1-$^{13}$C carbons of acetyl groups (as in pyruvate) and a number of $^{15}$N-labelled species (as in choline). Unfortunately, these are the nuclei that are most likely to have prohibitively long T1 values at the low temperatures required for brute-force polarization. In order to increase the rate at which such nuclei attain thermal equilibrium at low temperatures, one approach is to transfer polarization to these nuclei from other nuclei that relax more rapidly. Another is to incorporate some form of relaxation switch, whereby relaxation is enhanced at low temperatures but not during the subsequent warming process. A number of switching approaches have been proposed over the years, including the use of paramagnetic oxygen and of liquid $^3$He [3], but for bulk samples none has so far proved competitive with other techniques such as DNP.

In accordance with the invention it has been found that small particles, in particular metallic nanoparticles, might act as low temperature relaxation agents. It is known that the nuclei of metals such as silver, copper, platinum and aluminium continue to display measurable T1 relaxation even at ultra-low temperatures in the millikelvin range, following the Korringa Law [4]. This is because the conduction electrons with which the nuclear spins interact can give or take up the small amount of energy associated with transitions between the nuclear spin energy levels.

The inventors' idea is that conduction electrons, and/or the nuclear spins, can also relax other nuclei, for example the protons or other nuclear spin constituents of solutions into which the metals are introduced. Such relaxation effects should occur at the interface of the solution with the metal. These effects might then be transmitted away from the interface and into the bulk of the solution by means of spin diffusion. In order to enhance relaxation in this way, then it is beneficial to maximise the surface to volume ratio of the metals and to minimise the distance over which spin diffusion effects need to occur. Accordingly, solutions containing high concentrations of metallic nanoparticles should show significant relaxation enhancing effects. Moreover, the inventive idea can be generalized to materials having electrons which may take up small amounts of energy in general, e.g. conductive materials other than metals (such as graphene), or materials in which excitons can easily be excited (such as copper-I-oxide), in particular showing resonances on the nano electronvolts range.

Experimental Results

In order to explore the relaxation characteristics of several types of nanoparticles, the relaxation conferred to bulk (primarily solvent) protons has been explored. The reason for this is that the inventors have recently shown [5] that polarization can be transferred from the solvent protons to other more slowly relaxing nuclei (for example $^{13}$C or $^{31}$P nuclei) by low-field nuclear thermal mixing, a technique that equilibrates spin temperatures. The solvent relaxation properties and polarization can therefore be used as a surrogate indicator of the polarization that is available for target nuclei of interest (such as $13_C$).

The inventors investigated the relaxation properties of 50/50 water/glycerol solutions containing 2-molar 1-$^{13}$C-labelled sodium acetate and 1-molar sodium phosphate mixed with the nanoparticles. The volume ratio was one part nanoparticle to 4 or 8 parts of solution, and the nominal size of the nanoparticles ranged from 18 nm to 50 nm. FIG. 1 shows the proton $T_{1/2}$ values (i.e. the time taken to reach 50% of equilibrium polarization) measured as a function of temperature at field strengths of 2.4 T and 3.0 T as a function of temperature for several particle materials (see Methods below for further details); here $T_{1/2}$ values are quoted rather than T1 values because the relaxation tends to be non-exponential. The results show that copper and platinum are highly effective relaxation enhancers, particularly at the lower temperatures, whereas aluminium and silver are far less effective.

Figure 2:
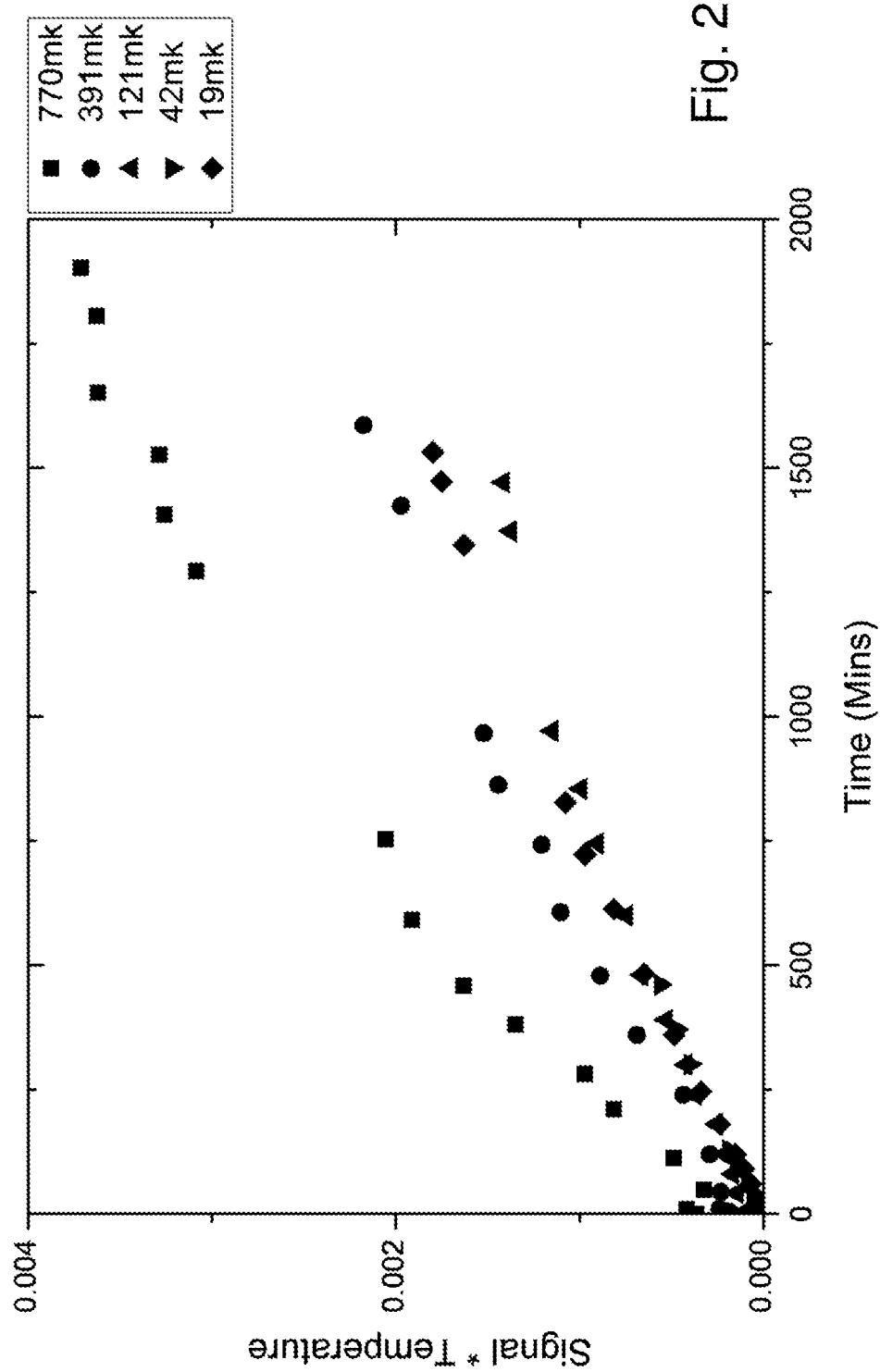
FIG. 2 shows a diagram illustrating the product of the NMR signal intensity of $^{13}C$ and temperature (in arbitrary units) versus polarization time, for a sample prepared according to the invention, with the sample containing copper nanoparticles as relaxation agent and a $^{13}C$ enriched sodium acetate as MR agent.
Figure 3:
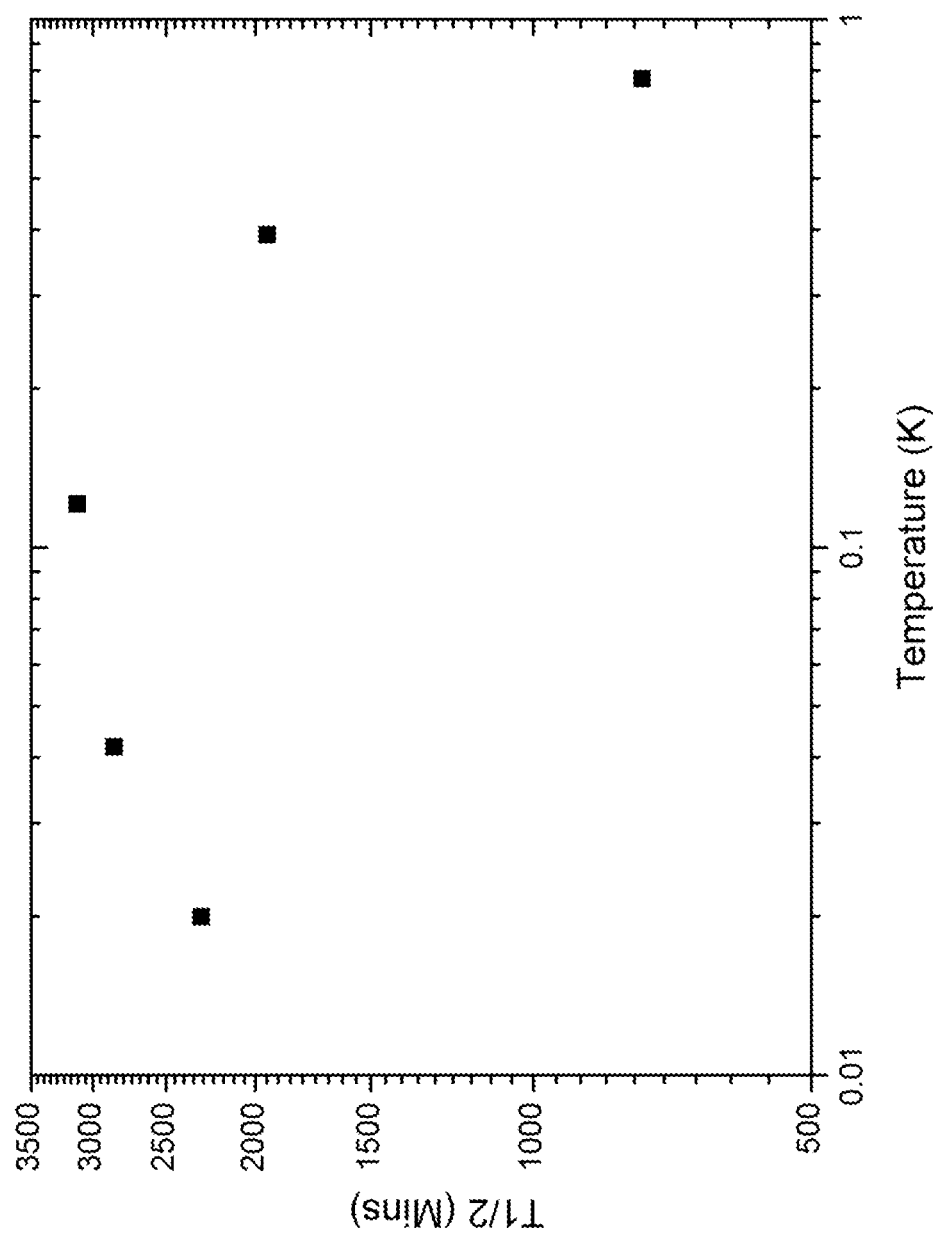
FIG. 3 shows a diagram illustrating T1/2 values of $^{13}C$ polarization, based on the data shown in FIG. 2.

In practice the focus is less on polarizing the solvent protons, but rather on achieving high polarization levels of the $^{13}$C nuclei. The sample that yielded the shortest proton $T_{1/2}$ values (the copper nanoparticle sample) was therefore used to investigate $^{13}$C $T_{1/2}$ values. Data were obtained at 9.74 T (the field at which the $^{13}$C signal was on resonance in the equipment used) and at a range of temperatures, as shown in FIG. 2. The $T_{1/2}$ values showed a remarkably modest temperature dependence in the range 770 mK to 19 mK; the $T_{1/2}$ value of about 40 hours at 19 mK was only 3 times as long as the value at 770 mK, compare FIG. 3. The equilibrium polarization for $^{13}$C at 9.74 T and 20 mK is about 12%, and without any need for dedicated polarization transfer measures $^{13}$C polarization of about 4% were obtained in 24 hours. The bulk of this $^{13}$C signal is from the labelled 1-$^{13}$C sodium acetate, which contains about ten times more $^{13}$C than the glycerol in the solvent (which contains $^{13}$C at 1.1% natural abundance). The timescale of 40 hours contrasts with the $T_{1/2}$ estimate of at least a year for the $^{13}$C signal measured in the presence of the aluminium nanoparticles at a similar temperature. This gives some indication of the degree of relaxation enhancement conferred by the copper nanoparticles.

In an attempt to obtain even higher polarization levels, the inventors investigated another sample with a volume ratio of copper nanoparticles to solution of 1:4. When the base temperature of 15 mK was reached, the field was raised to 14 T and then cycled back to 9.74 T (at a rate of 0.2 T/min) for signal acquisition. A period of 24 hours at 14 T and 15 mK yielded a $^{13}$C polarization of 6%, while a period of 6 days yielded a growth in $^{13}$C polarization from its initial value of 3% to a final value of 18%. The equilibrium polarization at 14 T and 15 mK would be 23%, so $T_{1/2}$ can be estimated to be about 2-3 days.

Evaluation

The experimental results show that high $^{13}C$ polarization levels can be achieved in realistic periods of time using the inventive enhanced brute force—or EBF—techniques. These high polarization levels rely simply on the relaxation enhancing properties of small particles, in particular metallic nanoparticles, but the additional use of cross-polarization techniques (transferring polarization from protons to $^{13}C$ nuclei, either before or after rewarming/dissolution) could provide further reductions in time. Moreover, optimisation of the experimental conditions, for example through further exploration of the effects of nanoparticle size, composition, morphology, and concentration, may increase the achievable polarization level and/or reduce the required polarization time.

Furthermore, the inventive method offers a number of technical advantages. In particular, the basic polarization process does not involve any resonance phenomena or radiofrequency irradiation. This greatly simplifies the technology; for example the magnetic field does not have to be particularly homogeneous. In addition, the process is completely broadband; thus a wide range of nuclear species, as well as large quantities of samples, could be polarized simultaneously, particularly if combined with low-field thermal mixing, which is also broadband in nature. An additional advantage is that sample preparation is very easy, and the relaxation enhancer, i.e. the small particles (such as metallic nanoparticles), should be easily removable following polarization; the solution itself contains no added chemicals.

Considering that polarizing multiple samples simultaneously should be simple in the inventive brute force approach, and individual samples may be released and delivered for the rewarming/dissolution/analysis process as and when required, the polarization times (although long as compared to dissolution DNP) seem acceptable. On this basis, a timescale of several days for polarization should not be a problem, as long as sufficient numbers of samples can be polarized at the same time. One can also envisage devices that may be more remotely sited and that could be specifically designed for longer-term larger-scale production and storage of highly polarized materials.

The inventive methodology and technology could play an extremely useful role in the preparation, storage and analysis of highly polarized materials for use in the basic and clinical sciences.

Methodology

Experiments at temperatures below 4K were carried out using a spectrometer that operates at any chosen field up to 15 T, and forms part of a dilution refrigerator-cooled system that yields sample temperatures as low as 10 mK. Field cycling on this system can be carried out at rates of 1 T min$^{-1}$. $^1H$ and $^{13}C$ spectra were acquired at the radiofrequency coil resonance frequency of 104.3 MHz, at fields of 2.45 T and 9.74 T respectively. At very low temperatures, $^1H$ spectra were also acquired at 3 T. At this field the RF coil is not perfectly tuned to the Larmour frequency, thereby avoiding radiation damping effects associated with the very large signals obtained on resonance at these temperatures. T1 measurements were carried out using 5° radiofrequency pulses applied at a range of intervals following a single saturation.

Samples were prepared by mixing 50/50 vol % water/glycerol solutions containing 2 molar 1-$^{13}C$-labelled sodium acetate and 1 molar sodium phosphate mixed with nanoparticles. The volume ratio was one part nanoparticle to 4 or 8 parts of solution, and the resulting mixtures had a wet sandy consistency. Copper (size 25 nm, purity 99.8%), silver (size 20-30 nm, purity 99.95%) and aluminium (size 18 nm, purity 99.9%), and graphene (size 11-15 nm) nanoparticles were obtained from SkySpring Nanomaterials Inc; platinum (size <50 nm) and copper (II) oxide (size <50 nm) nanoparticles were obtained from Sigma Aldrich.

Basic Course of the Inventive Method

Figure 4:
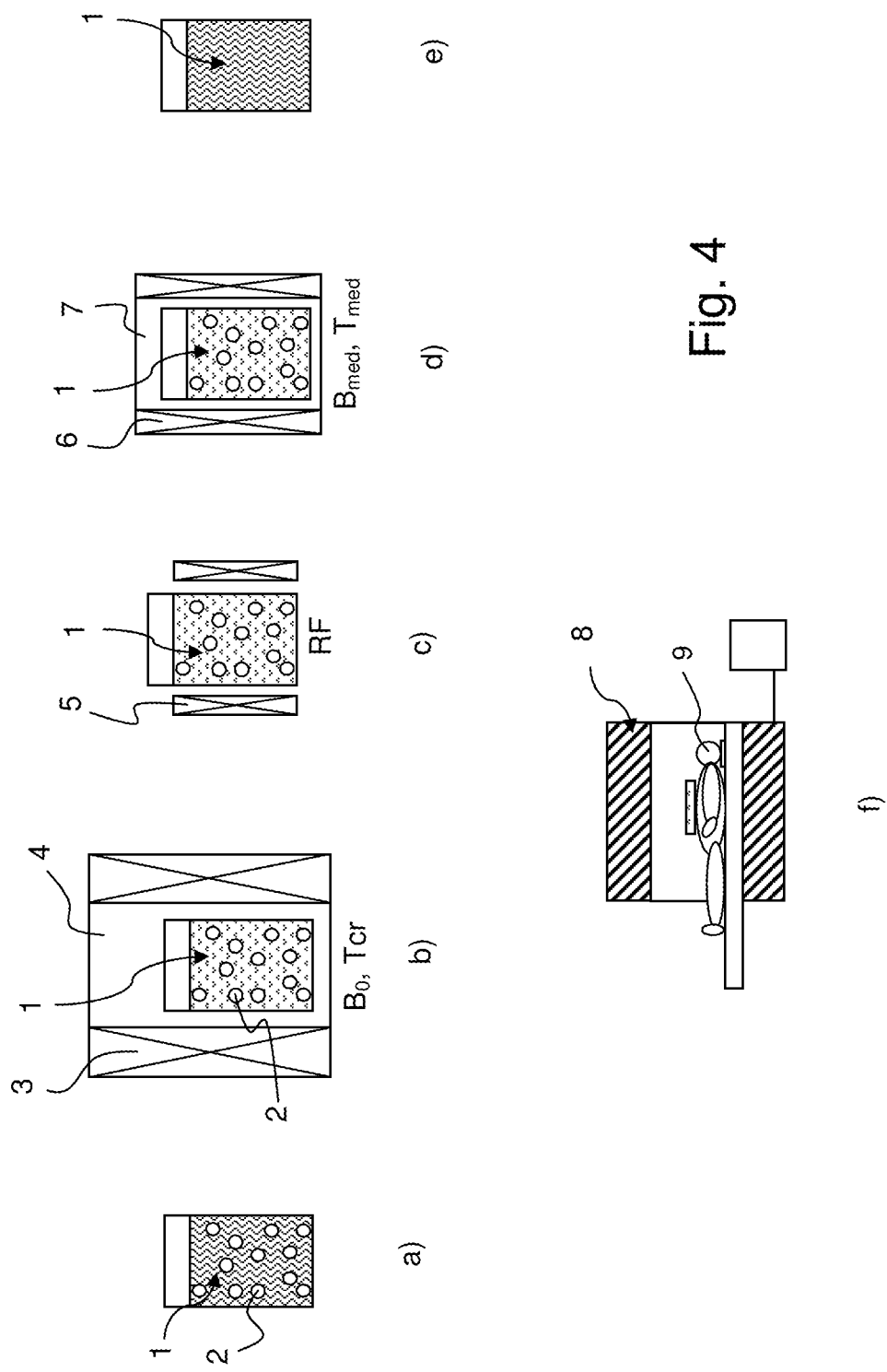
FIG. 4 shows a schematic illustration of the steps of the inventive method by way of example.

FIG. 4 describes in a schematic overview the steps of the inventive method in an example. In a step a), a sample 1 is provided (or prepared, typically at room temperature), wherein the sample 1 here comprises a solvent (such as water, containing protons) with a dissolved MR agent (such as sodium acetate enriched in $^{13}C$), and with a particulate relaxation agent 2. The particles of the relaxation agent 2 typically have a D50 diameter of about 100 nm or less, with copper being a preferred material of the particles. In a step b), the sample 1 is exposed to a static magnetic field $B_0$, here of 10 T generated by a superconducting magnet 3, and a cryogenic temperature Tcr, here of 100 mK, present in a cryostat 4. Note that the sample 1 or the solvent, respectively, are frozen then. Both the protons contained above all in the solvent and the $^{13}C$ nuclei contained in the MR agent begin to polarize, with the polarization build-up in the protons occurring much faster than in $^{13}C$. The polarization build-up is accelerated by the particulate relaxation agent 2, but still takes typically a few hours or more. In a subsequent step c), polarization is transferred from the protons of the solvent to the $^{13}C$ nuclei in the MR agent here by Cross polarization, using RF coils 5, irradiating the sample 1 with an appropriate RF pulse sequence such as a Hartmann Hahn contact pulse sequence. In general, the sample 1 is still cooled and exposed to a static magnetic field during this step. Then here the sample 1 is stored in a step d) at an intermediate temperature Tmed and at an intermediate field Bmed until use, typically for a few hours or days. A further magnet 6 (e.g. a permanent magnet) and a further cryostat 7 (e.g. LN$_2$ cooled) may be used for this purpose. In the next step e), the sample 1 is liquefied for example by adding hot solvent and filtered (typically at room temperature) such that the particulate relaxation agent is completely removed from the sample 1. The liquefied sample 1 may then be used in an NMR experiment, such as in an MR imaging experiment in a tomograph 8 on a living human patient 9, compare step f); the NMR experiment typically takes place within just a few minutes (such as within 5 minutes) or even only a few seconds after the liquefying and filtering of step e).

LITERATURE

1. Ardenkjaer-Larsen J H, Fridlund B, Gram A, Hansson G et al (2003). Increase in signal-to-noise ratio of >10,000 times in liquid-state NMR. Proc. Natl. Acad. Sci. USA 100:10158-10163.
2. Waugh J S and Slichter C P (1989). Reply to "Comment on 'Mechanism of nuclear spin-lattice relaxation in insulators at very low temperatures'". Phys. Rev. B 40:4203-4204.
3. Biskup N, Kalechofsky N and Candela D (2003). Spin polarization of xenon films at low-temperature induced by $^3$He. Physica B 329:437-438.
4. Korringa J (1951). Nuclear magnetic relaxation and resonnance line shift in metals. Physica 16:601-610.
5. Gadian D G, Panesar K S, Perez Linde A J, Horsewill A J, Kockenberger W and Owers-Bradley J R (2012). Preparation of highly polarized nuclear spin systems using brute-force and low-field thermal mixing. Phys. Chem. Chem. Phys. 14:5397-5402.

We claim:

1. A method for hyperpolarizing nuclei contained in an MR (=magnetic resonance) agent using Brute Force, the method comprising the steps of:
 a) providing a sample comprising a relaxation agent and the MR agent or the MR agent dissolved in a solvent, wherein the relaxation agent is a particulate relaxation agent comprising particles of a grain size of 20 μm or less, wherein high γ nuclei are contained in the sample and low γ nuclei are contained in the MR agent; and
 b) exposing the sample to a magnetic field $B_0$, with $B_0 \geq 0.5$ T, and at a cryogenic temperature Tcr, with Tcr≤5K.

2. The method of claim 1, wherein the nanoparticles or solid particles are electrically conductive and/or conductively coated particles.

3. The method of claim 1, wherein the nanoparticles or solid particles have a volume content within the sample of 5% or more, 10% or more or 20% or more.

4. The method of claim 1, wherein a D50 grain size of the nanoparticles or solid particles is 100 nm or less, 50 nm or less, 30 nm or less or 20 nm or less.

5. The method of claim 1, wherein the method further comprises the step of:
 c) transferring polarization form the high γ nuclei contained in the sample polarized in step b) to the low γ nuclei contained in the MR agent.

6. The method of claim 5, wherein transferring the polarization in step c) is done by Cross Polarization, with the sample thereby being irradiated with an RF pulse sequence.

7. The method of claim 5, wherein transferring the polarization in step c) is done by low field nuclear thermal mixing.

8. The method of claim 1, wherein the high γ nuclei are $^1H$ and/or $^{19}F$ and/or the low γ nuclei are $^{13}C$ and/or $^{15}N$ and/or $^{31}P$.

9. The method of claim 1, wherein the sample includes a solvent containing $^1H$ nuclei, containing water and/or containing glycerol.

10. A method for hyperpolarizing nuclei contained in an MR (=magnetic resonance) agent using Brute Force, the method comprising the steps of:
 a) providing a sample comprising a relaxation agent and the MR agent or the MR agent dissolved in a solvent, wherein the relaxation agent is a particulate relaxation agent comprising particles of a grain size of 20 μm or less;
 b) exposing the sample to a magnetic field $B_0$, with $B_0 \geq 0.5$ T, and at a cryogenic temperature Tcr, with Tcr≤5K; and
 c) liquefying, following step b), the sample by melting the sample or dissolving the sample in a solvent or in a heated solvent.

11. The method of claim 10, wherein the particles are removed from the liquefied sample by filtration.

12. A method of NMR spectroscopy or MR imaging, wherein a liquefied sample is produced according to the method of claim 11 and an NMR spectroscopy or MR imaging measurement is done on hyperpolarized nuclei contained in the liquefied sample.

13. A method of NMR spectroscopy or MR imaging, wherein a liquefied sample is produced according to the method of claim 10 and an NMR spectroscopy or MR imaging measurement is done on hyperpolarized nuclei contained in the liquefied sample.

14. The method of claim 10, wherein the nanoparticles or solid particles are electrically conductive and/or conductively coated particles.

15. The method of claim 10, wherein the nanoparticles or solid particles have a volume content within the sample of 5% or more, 10% or more or 20% or more.

16. The method of claim 10, wherein a D50 grain size of the nanoparticles or solid particles is 100 nm or less, 50 nm or less, 30 nm or less or 20 nm or less.

17. The method of claim 10, wherein the sample includes a solvent containing $^1H$ nuclei, containing water and/or containing glycerol.

* * * * *